(12) United States Patent
Katz

(10) Patent No.: US 6,403,397 B1
(45) Date of Patent: Jun. 11, 2002

(54) PROCESS FOR FABRICATING ORGANIC SEMICONDUCTOR DEVICE INVOLVING SELECTIVE PATTERNING

(75) Inventor: Howard Edan Katz, Summit, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/605,507

(22) Filed: Jun. 28, 2000

(51) Int. Cl.$^7$ ............................................... H01L 51/40
(52) U.S. Cl. ........................................... 438/99; 438/29
(58) Field of Search .............................. 438/29, 35, 55, 438/82, 99, 151, 455, 780, 149, 164, 237, 328, 466, 584

(56) References Cited

U.S. PATENT DOCUMENTS

| | | | |
|---|---|---|---|
| 4,381,951 A | | 5/1983 | Baron et al. |
| 4,909,863 A | * | 3/1990 | Birkmire et al. ........... 148/33.4 |
| 5,536,573 A | | 7/1996 | Rubner et al. |
| 5,936,259 A | * | 8/1999 | Katz et al. .................... 257/40 |
| 6,060,121 A | | 5/2000 | Hidber et al. |

OTHER PUBLICATIONS

Y. Xia et al., "Soft Lithography," *Angew, Chem. Int. Ed.*, vol. 37, 550–575 (1998).
K. A. Connors, *Binding Constants*, John Wiley & Sons, 6–12 (1987).
G. C, Maitland et al., *Intermolecular Forces*, Oxford University Press, 8–23 (1987).
K. Tadanaga, et al., "Superhydrophobic–Superhydrophilic Micropatterning on Flowerlike Alumina Coating Film by the Sol–Gel Method", *Chem. Mater.* 12, 590–592 (2000).
Y. Xia, "Microcontact Printing of Octadecysiloxane on the Surface of Silicon Dioxide and its Application in Microfabrication", *J. Am. Chem. Soc.* 117, 9576–9577 (1995).
A. Kumar, et al., "Patterned Condensation Figures as Optical Diffraction Gratings", *Science*, vol. 263, 60–62 (1994).
R. Singhvi, et al., "Engineering Cell Shape and Function", *Science*, vol. 264, 696–698 (1994).
C. B. Gorman, et al., "Fabrication of Patterned, Electrically Conducting Polypyrrole Using a Self–Assembled Monolayer: A Route to All–Organic Circuits", *Chem. Mater.* 7, 526–529 (1995).
N. L. Jeon et al., "Patterned Self–Assembled Monolayers Formed by Microcontact Printing Direct Selective Metalization by Chemical Vapor Deposition on Planar and Nonplanar Substrates", *Langmuir*, 11, 3024–3026(1995).
IBM disclosure regarding affinity–adjustment to surface.
U.S. Patent application Ser. No. 09/280,172, filed Mar. 29, 1999.
U.S. Patent application Ser. No. 09/280,103, filed Mar. 29, 1999.
U.S. Patent application Ser. No. 09/476,511, filed Jan. 3, 2000.
U.S. Patent application Ser. No. 09/572,207, filed May 17, 2000.

* cited by examiner

*Primary Examiner*—David Nelms
*Assistant Examiner*—Phuc T. Dang
(74) *Attorney, Agent, or Firm*—Scott J. Rittman

(57) ABSTRACT

An improved process for forming devices utilizing patterned organic semiconductor films is provided. The process involves treating a surface to selectively provide regions of greater affinity and lesser affinity for an organic semiconductor or an organic semiconductor solution. When the organic semiconductor, or solution comprising the semiconductor, is deposited on the treated surface, either the organic semiconductor or the organic semiconductor solution dewets from the lesser affinity regions or the resultant film adheres only weakly to the lesser affinity regions such that selective removal is readily performed. And even where such removal is not performed, the portions of the organic semiconductor film overlying the greater affinity regions exhibit higher mobility and better film continuity relative to the other portions of the film.

16 Claims, 1 Drawing Sheet

PROCESS FOR FABRICATING ORGANIC SEMICONDUCTOR DEVICE INVOLVING SELECTIVE PATTERNING

BACKGROUND OF THE INVENTION

1. Field of the Invention

The invention relates to organic semiconductor devices.

2. Discussion of the Related Art

Field-effect transistors (FETs) with organic semiconductors as active materials are the key switching components of contemplated organic control, memory, or logic circuits, also referred to as plastic-based circuits. An expected advantage of such plastic electronics is the ability to fabricate them more easily than traditional silicon-based devices. Plastic electronics would thus provide a cost advantage in cases where it is not necessary to attain the performance level and device density provided only by silicon-based devices. For example, organic semiconductors are expected to be much more readily printable than vapor-deposited inorganics, and are also expected to be less sensitive to air than recently-proposed solution-deposited inorganic semiconductor materials. For these reasons, there have been significant efforts expended in the area of organic semiconductor materials and devices.

Generally, in fabricating such FETs, the organic semiconductor is formed as a continuous film covering many devices simultaneously or even covering the entire circuit. (An organic semiconductor film is an assembly of organic molecules or polymerized organic monomers formed such that the film is capable of being active in a semiconductor device, e.g., by allowing current to flow between source and drain electrodes with use of a gate.) It is often desirable to have the semiconductor film present only at selected regions of a circuit, or selected regions of an individual device, to achieve, for example, lessened leakage current and crosstalk. Such selective formation also enables the use of different semiconductors in different regions of a device or in different devices of a circuit.

Various methods for patterning deposited films have been developed. For example, it is possible to use established photoresist technology to pattern a deposited organic film. Unfortunately, conventional steps such as reactive ion etching and solvent development tend to leave unwanted residue and also have the potential to degrade the semiconductor film. As an alternative, for some materials it is possible to selectively deposit, e.g., print, a solution of an organic semiconductor onto a substrate such that a semiconductor film is formed upon evaporation of the solvent. Unfortunately, such solutions are often not viscous enough to hold a desired shape upon printing, and may spread or contract depending on the surface forces. In addition, such solutions often are not concentrated enough to form an adequate film after a single printing step, and thus multiple deposition steps are required.

Improved techniques for providing patterned organic semiconductor films are therefore desired.

SUMMARY OF THE INVENTION

The invention provides an improved process for forming devices utilizing patterned organic semiconductor films. The process involves treating a surface to selectively provide regions of greater affinity and lesser affinity for an organic semiconductor or an organic semiconductor solution (i.e., an organic semiconductor material in a solvent). When the organic semiconductor, or solution comprising the semiconductor, is deposited on the treated surface, either the organic semiconductor or the organic semiconductor solution dewets from the lesser affinity regions or the resultant film adheres only weakly to the lesser affinity regions such that selective removal is readily performed. And even where such removal is not performed, the portions of the organic semiconductor film overlying the greater affinity regions exhibit higher mobility and better film continuity relative to the other portions of the film.

Regions of greater affinity are generally created by providing a surface with moieties that interact favorably with the organic semiconductor material to be deposited thereon (or its solvent in the case of a solution). Regions of lower affinity are generally created by providing a surface with moieties that are less compatible with moieties on the organic semiconductor material (or its solvent in the case of a solution). It is possible for the surface treatment to involve providing an affinity-increasing material in selected areas, such that the remaining surface constitutes the lower affinity regions. It is also possible for the treatment to involve providing the surface with an affinity-reducing material in selected areas, such that the remaining surface constitutes the greater affinity regions. Other combinations are also possible.

In one embodiment, the organic semiconductor film is formed over the entire treated surface. Portions of the film overlying regions of low affinity are then removed. The differences in affinity between the greater affinity regions and lower affinity regions allows such removal to be readily and selectively performed. In another embodiment, a semiconductor solution selectively and spontaneously wets primarily, or even exclusively, the regions of greater affinity prior to solvent evaporation. The resultant film is therefore present primarily, or exclusively, on the regions of greater affinity, with no need to remove undesired portions of the film.

DETAILED DESCRIPTION OF THE INVENTION

Device Structure

Figure 1:
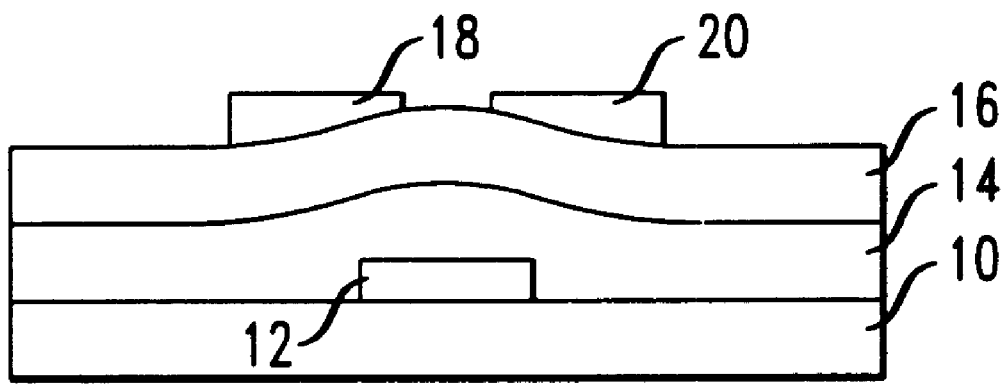
FIG. 1 illustrates an organic field effect transistor having top contact geometry.
Figure 2:
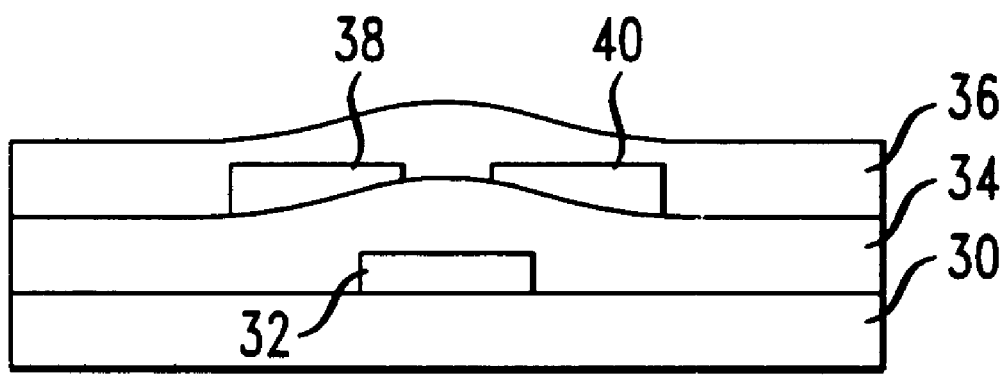
FIG. 2 illustrates an organic field effect transistor having bottom contact geometry.

The invention relates to fabrication of devices incorporating organic semiconductor films. Typically, the films are part of an organic FET. FETs are generally formed with either a top contact geometry or a bottom contact geometry. The top contact geometry, as shown schematically in FIG. 1, generally involves depositing a semiconductor film 16 onto a dielectric surface 14, followed by formation of source and drain contacts, 18, 20, on top of the semiconductor film. (Dielectric indicates a material having a resistivity of at least $10^{10}$ ohm-cm.) (In the top contact embodiment of FIG. 1, an insulating substrate 10 is first provided, with a gate contact 12 formed thereon.) The top contact geometry tends to be widely used, particularly for testing of semiconductor films, because the application of electrodes to the already deposited semiconductor film ensures intimate contact over much of the electrode area, thereby giving reliable test results. Some contemplated circuit applications and test vehicles, however, require a bottom contact geometry, as shown in FIG. 2. In such a geometry, source and drain contacts 38, 40 are formed onto a dielectric layer 34, with the semiconductor layer 36 being formed over at least a portion of the contacts 38, 40, and over a portion of the dielectric layer 34. (In the embodiment of FIG. 2, the dielectric 34 is formed over a substrate 30 having a gate contact 32 formed thereon.)

In one embodiment of the invention, a bottom contact geometry FET is formed as follows (see also FIG. 2). First, a substrate is provided. It is possible for the substrate to be conductive, in which case the substrate will serve as a gate contact. If the substrate is an insulating material, a gate contact is formed on the substrate. Suitable insulating materials include silicon oxide, other oxides such as glass and alumina, and polymeric substrates such as polyimide and Mylar® polyester. typical gate contact materials include gold, aluminum, and indium tin oxide. A dielectric layer is then formed over at least a portion of the gate contact. Suitable dielectric materials include silicon oxide, spin-on glass, and liquid-phase processable polymeric materials such as polyimides and poly(methacrylates). Advantageously, materials capable of being handled and applied in a roll-to-roll process are used.

Metal contacts are then formed on the dielectric layer, by any suitable technique. For example, it is possible to form the contacts by a vapor deposition process, e.g., by evaporation or sputtering of the metal through a conventional shadow mask, or by photolithographic patterning of a continuous gold film. It is also possible to form the contacts by stamping techniques, e.g., microcontact printing, such as discussed in Y. Xia and G. M. Whitesides, "Soft Lithography," Angew. Chem. Int. Ed., Vol. 37, 550–575 (1998).

According to this embodiment, once the contacts are formed, the exposed surface, which may include portions of the substrate, the dielectric layer, and the contacts, is treated to provide the increased and/or decreased affinity, as discussed in more detail below. It is also possible to generate the bottom contact geometry by forming the contacts after the surface treatment. (In other embodiments, e.g., top contact geometries, it is possible to form the contacts after formation of a semiconductor film, or after selective removal of portions of a semiconductor film (if such removal is performed).) The actual material or materials on which the semiconductor film is formed will thus vary depending on the configuration of the FET or other component, and a variety of such materials are capable of being treated.

The organic semiconductor is then formed over the contacts, dielectric, and/or substrate (see, e.g., FIG. 2). The semiconductor material is deposited by any suitable method. For example, deposition into a film from solution is possible, as reflected in the examples below. The solvent (which is intended to mean one or more solvents) typically contains at least one non-aqueous solvent. More typically, the solvent contains only non-aqueous solvents, in which case the non-aqueous solvents are generally not miscible with water at room temperature. Suitable solvents include toluene, xylene, chlorobenzene, chloroform, and n-butanol. Deposition of the organic material directly is also possible, e.g., by a rapid sublimation technique. One such rapid sublimation method is to apply a vacuum of $10^{-3}$ to $10^{-5}$ torr to a chamber containing a substrate and a source vessel that holds the compound in powdered form, and heat the vessel over several seconds until the compound sublimes onto the substrate. The mobility of such films is capable of being increased by carefully controlling the heating rate, maximum source temperature, and/or substrate temperature during the process. Conventional sublimation of the organic semiconductor material is also possible.

Possible organic semiconductor materials are reflected in the examples below, and include materials based on the naphthalene-1,4,5,8-tetracarboxylic diimide (NTCDI) framework, naphthalene-1,4,5,8-tetracarboxylic dianhydride (NTCDA), copper phthalocyanine, perfluorinated copper phthalocyanine, regioregular poly (3-hexylthiophene) (RR-PHT), 2,5-linked thiophene tetramers, pentamers, and hexamers (also known as alpha-4T, alpha-5T, and alpha-6T compounds)—either unsubstituted or substituted at the terminal 5 positions with linear alkyl or alkoxyalkyl chains of about 4 to about 12 atoms in length, co-oligomers of 2,5-linked thiophene rings and 1,4-linked benzene rings about 5 rings long—either unsubstituted or substituted as described for the thiophene oligomers (e.g., 1,4-bis(5-(5-hexylthien-2-yl)thien-2-yl)benzene (DHT4Ph)), 11,11,12,12-tetracyanonaphtho-2,6-quinodimethane, pentacene, naphthacene, and anthradithiophene (ADT) and terminal dialkyl derivatives thereof (e.g., dihexylanthradithiophene—DHADT). (The DHT4Ph used in the examples was synthesized according to procedures described for hexylated 5- and 6-ring compounds in W. Li et al, Chem. Mater., Vol. 11, page 458 (1999), using 1,4-diiodobenzene as the source of the benzene ring.) Other materials are also possible in accordance with the guidelines presented herein.

Subsequent processing steps are known to those in the art. A variety of components incorporating organic FETs are possible, including complementary inverter circuits, ring oscillators, and shift registers. A variety of organic semiconductor devices are also possible, including solar cells and diodes.

Surface Treatment

Regions of greater affinity are generally created by providing a surface with moieties that interact favorably with the organic semiconductor material to be deposited thereon (or its solvent in the case of a solution). Regions of lower affinity are generally created by providing a surface with moieties that are less compatible with moieties on the organic semiconductor material (or its solvent in the case of a solution). For example, the attachment of a fluorocarbon chain to a species will tend to decrease the solubility or miscibility of that species with another species to which an aromatic ring is attached. Similarly, the attachment of a hydrocarbon chain to a species will tend to decrease that species' solubility or miscibility with another species to which an OH group is attached, thereby suggesting a decreased compatibility.

It is possible for the surface treatment to involve providing an affinity-increasing material in selected areas, such that the remaining surface constitutes the lower affinity regions. It is also possible for the treatment to involve providing the surface with an affinity-reducing material in selected areas, such that the remaining surface constitutes the greater affinity regions. Both of these treatments are optionally performed by forming a continuous film of the affinity-defining material, and then selectively removing or degrading portions of that film. (In accordance with these possible embodiments, the term treatment, as used herein, is intended to encompass providing such material on one region of a surface, while leaving or restoring other regions of a surface in their original state.) Other combinations are also possible.

Classes of favorable intermolecular interactions are known in the art, as discussed, for example, in K. A. Connors, Binding Constants, John Wiley & Sons, 1987, 6–12; and G. C. Maitland et al., Intermolecular Forces, Oxford University Press, 1987, 8–23. These include attractive forces between dipoles (permanent and/or induced, including those in π-conjugated systems), hydrogen bonds, and charge transfer complexation. If the semiconductor film is expected to exhibit any of these favorable interactions with a molecular subunit, then it is possible to increase the affinity by incorporating that subunit into a moiety located on the desired portion of the surface on which the semiconductor film is to be formed.

It is possible to affix the affinity-defining moieties to a surface through chemical bonding, e.g., Si—O—Si bond formation, or other so-called coupling group chemistry, as is known in the art. Even the dilute presence of coupling groups may be sufficient to provide the desired effect. It is also possible to form films, e.g., polymer films, containing the moiety that provides the desired affinity, as long as the film is able to endure any process steps prior to and including formation of the organic semiconductor film. (It is possible to use adhesion promoters to help the film endure such additional steps.) typically, the pattern of the greater and lesser affinities is defined by printing the material containing the affinity-defining moieties onto the surface. Other techniques are also possible, including painting or writing the materials onto the surface. It is also possible to immerse portions of the surface in a fluid, e.g., a solution, containing materials comprising the affinity-defining moieties. Evaporation through a stencil is also possible, as is photolithographic definition of the materials. Advantageously, the technique for providing the affinity-defining moieties is compatible with printing techniques, e.g., roll to roll techniques, that are of particular interest for organic semiconductor devices. Other techniques for treating the surface are also possible, e.g., adjusting the surface topology to attain the greater and lesser affinity regions. Control runs are easily performed to find groups that provide a desired level of affinity for a particular surface.

The contrasting affinities, i.e., the greater and lesser affinities, are then utilized during and/or after depositing the organic semiconductor or organic semiconductor solution onto the treated surface. For example, it is possible to form a substantially continuous film on the treated surface, and then remove the portions of the film overlying the lesser-affinity regions. Such removal is typically performed by rubbing or by immersion in a solvent.

Alternatively, it is possible to directly form the organic semiconductor film primarily, or even exclusively, on the regions of greater affinity. For example, it is possible to deposit an organic semiconductor solution on a treated surface such that the solution wets primarily, or exclusively, the greater affinity regions. Upon evaporation of the solvent, the film is thus present primarily, or exclusively, on the greater affinity regions. Selective formation of semiconductor films onto greater affinity regions is also possible by adsorption of the semiconductor molecules from the gas phase.

If desired, it is possible to create the contrasting-affinity regions (typically lesser-affinity regions) by depositing a low capacitance layer, such as a relatively thick (e.g., 0.5 micron or more) polymer film onto a dielectric film (e.g., having a thickness of about 1 micron), where the dielectric constant of the affinity contrast-creating material is less than or equal to that of the dielectric film. In such a case, there will be a lower circuit capacitance associated with voltage differences between the gate electrodes and circuit elements (e.g., portions of the source/drain contacts) that are formed over such two-layer regions to the extent that such elements overlap both the two-layer regions and the gate electrodes. (To get this effect, all three elements—the gate, the two-layer region, and the circuit element—must be on top of each other in the device structure.)

Suitable affinity-defining materials are reflected in the examples.

The invention will be further clarified by the following examples, which are intended to be exemplary.

EXAMPLES

A variety of affinity-creating materials were used with a variety of organic semiconductor materials and a variety of substrates. The results are reflected in the Table below.

Unless otherwise indicated, the organic semiconductor materials were sublimed onto the substrate by the following process. The powdered semiconductor was loaded into a tantalum source that was resistively heated under vacuum in a bell jar evaporator, such that the material was vaporized and deposited onto a substrate at a pressure of $<10^{-5}$ torr.

Mobility measurements were performed by use of a conductive substrate—either doped silicon or indium-tin-oxide—at least partially coated with an oxide or polymer dielectric layer. A portion of the dielectric surface was treated with an affinity-altering material and a semiconductor was deposited, as presented in the Table. Source and drain contacts were fabricated before the dielectric surface treatment and/or after formation of the semiconductor layer, as presented in the Table. Gold contacts were formed by evaporation through a shadow mask, and carbon contacts were formed by painting carbon ink. Mobility was calculated from source-drain currents obtained at various gate voltages in the saturation regime, as known in the art.

TABLE

| Surface | Affinity — Defining Material | Technique for Applying Material | Organic Semiconductor | Effect on Organic Semiconductor Film |
| --- | --- | --- | --- | --- |
| Glass Cover Slip | - none (control)<br>- $C_{18}H_{37}Si(OMe)_3$<br>- $C_8F_{17}C_2H_4(SiOEt)_3$ | Dipped in solution of 5% material in xylene | NTCDA | Removal of film with cotton swab easier with silanes than control |
| Glass Cover Slip | - none (control)<br>- $C_{18}H_{37}Si(OMe)_3$<br>- $C_8F_{17}C_2H_4(SiOEt)_3$ | Dipped in solution of 5% material in xylene | Copper phthalocyanine | Removal of film with cotton swab easier only with fluorinated silane |
| Glass Cover Slip | - none (control)<br>- $C_8F_{17}C_2H_4(SiOEt)_3$ | Dipped in solution of 5% material in xylene | Regioregular-poly(3-dodecyl)thiophene spun from dilute | Semiconductor film formed only on control |

TABLE-continued

| Surface | Affinity — Defining Material | Technique for Applying Material | Organic Semiconductor | Effect on Organic Semiconductor Film |
|---|---|---|---|---|
| | | | solution of 0.001–0.01% semiconductor in $CHCl_3$ | |
| Glass Cover Slip | - none (control)<br>- $C_8F_{17}C_2H_4Si Me_2Cl$ | Dipped portion of surface in solution of 5% material in $CCl_4$ | Copper phthalocyanine | Cotton swab selectively removed film from treated region of surface |
| Glass Cover Slip | $C_8F_{17}C_2H_4SiCl_3$ | Dipped portion of surface in solution of 1% material in 1:1 hexane:$CCl_4$ | Copper phthalocyanine | Cotton swab selectively removed film from treated region of surface |
| Polyimide on portion of $SiO_2$ layer on Si | $C_8F_{17}C_2H_4SiCl_3$ | Dipped portions of polyimide and $SiO_2$ in solution of 1% material in 1:1 hexane:$CCl_4$ | Copper phthalocyanine | Cotton swab selectively removed film from treated regions of polyimide and $SiO_2$ |
| Glass Cover Slip | $C_8F_{17}C_2H_4SiCl_3$ | Dipped portion of surface in solution of 1% material in 1:1 hexane:$CCl_4$ | ADT | Cotton swab selectively removed film from treated region of surface |
| Polyimide on indium tin oxide (ITO) | Fluoropolymer (3M-722 obtained from 3M) | Cast onto portion of surface from fluorinated solvent | DHADT cast from solution of 50 ppm DHADT in chlorobenzene at 60–70° C. | - DHADT solution migrated away from treated regions<br>- mobility of 0.001 $cm^2$/Vs exhibited for carbon top contact from some devices in untreated regions |
| Glass resin on ITO on Mylar with a gold bottom contact in one region | Fluoropolymer (3M-722) | Painted fluoropolymer solution around a 1 to 2 $cm^2$ area that included the gold contact | DHT4Ph cast from solution of 100 ppm DHT4Ph in xylene at 100° C. | - Film formed only in bound area<br>- Mobility of 0.002 $cm^2$/Vs for gold<br>- Mobility of 0.02 $cm^2$/Vs for carbon top contact<br>- on/off ratio >2000 |
| Polyimide on ITO on glass with carbon top contact | Fluoropolymer (3M-722) | Painted fluoropolymer solution around a 1 to 2 $cm^2$ area that included the gold contact | DHT4Ph cast from solution of 100 ppm DHT4Ph in xylene at 100° C. | - Film formed only in bound area<br>- Mobility of 0.01 $cm^2$/Vs<br>- on/off ratio of ~3 |
| PMMA-HEMA[a] cross-linked in 10:1 ratio on Kapton ™ with gold bottom contact | Fluoropolymer (3M-722) | Painted fluoropolymer solution around a 1 to 2 $cm^2$ area that included the gold contact | DHT4Ph cast from solution of 100 ppm DHT4Ph in xylene at 100° C. | - Film formed only in bound area<br>- Mobility of 0.01 $cm^2$/Vs<br>- on/off ratio of ~200 for carbon top contact |
| $SiO_2$ on Si | Fluoropolymer (3M-722) | Painted fluoropolymer solution around a 0.5 $cm^2$ area that included the gold contact | Hydroxyhexyl-NTCDI cast from solution of 100 ppm semiconductor in butanol at 70° C. | - Film formed only in bound area<br>- Mobility of 0.0005 $cm^2$/Vs for carbon top contact |
| $SiO_2$ on Si | Fluoropolymer (3M-722) | Painted fluoropolymer solution around a 0.5 to 1 $cm^2$ area that included the gold contact | DH$\alpha$5T cast from solution of 200 ppm DH$\alpha$5T in toluene at 80° C. | - Film formed only in bound area<br>- Mobility of 0.03 $cm^2$/Vs for carbon top contact |
| Glass resin (Techneglas GR 720 P) | Fluoropolymer (3M-722) | Painted fluoropolymer solution around a 0.5 to 1 $cm^2$ area that included the gold contact | DH$\alpha$5T cast from solution of 200 ppm DH$\alpha$5T in toluene at 80° C. | - Film formed only in bound area<br>- Mobility of 0.007 $cm^2$/Vs for carbon top contact |
| $SiO_2$ on Si | Vinyl hydride PDMS resin[b] with a trace of Pt | Painted a solution of 2% material in toluene around an area of >1 $cm^2$ and cured at 100° C. for 15 minutes | Hydroxyhexyl-NTCDI cast from solution of 100 ppm semiconductor in butanol at 70° C. | - Film formed only in bound area<br>- Mobility of 0.0006 $cm^2$/Vs for carbon top contact |

TABLE-continued

| Surface | Affinity — Defining Material | Technique for Applying Material | Organic Semi-conductor | Effect on Organic Semiconductor Film |
|---|---|---|---|---|
| SiO$_2$ on Si | Fluoropolymer (3M-722) | Painted fluoropolymer solution around an area of 1 cm$^2$ | RR-PHT cast from solution of 0.1% RR-PHT in xylene | - Film formed only in bound area<br>- Mobility of 0.005 cm$^2$/Vs for carbon top contact |
| SiO$_2$ on Si | C$_8$F$_{17}$C$_2$H$_4$SiCl$_3$ | Painted solution of 1% material in toluene around an area of 1.5 cm$^2$ | RR-PHT cast from solution of 0.1% RR-PHT in xylene | - Film formed only in bound area<br>- Mobility of 0.003 cm$^2$/Vs for carbon top contact |
| PMMA-HEMA[a] cross-linked in 10:1 ratio on ITO | C$_8$F$_{17}$C$_2$H$_4$SiCl$_3$ | Painted solution of 1% material in toluene around an area of 0.5 cm$^2$) | RR-PHT cast from solution of 0.1% RR-PHT in xylene | - Film formed only in bound area<br>- Mobility of 0.02 cm$^2$/Vs for carbon top contact |

[a]Polymethyl methacrylate — 2-hydroxyethyl methacrylate crosslinked with methylenebis (4-isocyanato benzene)
[b]1.1 g of 7% vinylated poly(dimethylsiloxane) and 0.6 g of 15% hydrido poly(dimethylsiloxane)

Other embodiments of the invention will be apparent to those skilled in the art from consideration of the specification and practice of the invention disclosed herein.

What is claimed is:

1. A process for fabricating a device, comprising the steps of:
   providing a surface;
   treating the surface to selectively provide at least one region of greater affinity for an organic semiconductor or an organic semiconductor solution and at least one region of lesser affinity for the organic semiconductor or the organic semiconductor solution; and
   forming on the treated surface an organic semiconductor film from the organic semiconductor or the organic semiconductor solution.

2. The process of claim 1, further comprising the step of at least partially removing the portion of the organic semiconductor film formed on the at least one region of lesser affinity.

3. The process of claim 2, wherein substantially all the organic semiconductor film is removed from the at least one region of lesser affinity.

4. The process of claim 1, wherein the step of forming comprises depositing the organic semiconductor solution on the treated surface, and evaporating the solvent.

5. The process of claim 4, wherein substantially no organic semiconductor solution wets the at least one region of lesser affinity film, such that the at least one region of lesser affinity comprises substantially no organic semiconductor film after evaporation of the solvent.

6. The process of claim 1, wherein the provided surface comprises a dielectric material.

7. The process of claim 6, wherein the provided surface further comprises metal contacts.

8. The process of claim 7, wherein the device comprises a field effect transistor that further comprises a gate.

9. The process of claim 1, wherein the regions of greater affinity or lesser affinity are created by providing the surface with selected moieties or by formation of a continuous or discontinuous polymer film on the surface.

10. The process of claim 9, wherein the treating step comprises forming the continuous or discontinuous polymer film onto a dielectric film, and wherein the dielectric constant of the polymer film is less than or comparable to that of the dielectric film.

11. The process of claim 10, wherein the device is a field effect transistor further comprising source and drain contacts and a gate, wherein the source and drain contacts at least partially overlap both the gate electrode and regions where the polymer film is formed on the dielectric film, and wherein the device exhibits a lower circuit capacitance associated with the regions where the source and drain contacts at least partially overlap both the gate electrode and the regions where the polymer film is formed on the dielectric film.

12. The process of claim 1, wherein the at least one region of greater affinity is provided by selectively providing the surface with moieties that interact favorably with the organic semiconductor material or with the solvent of the organic semiconductor solution relative to the at least one region of lower affinity.

13. The process of claim 1, wherein the at least one region of lesser affinity is provided by selectively providing the surface with moieties that are less compatible with moieties on the organic semiconductor material or with the solvent of the organic semiconductor solution, relative to the at least one region of greater affinity.

14. The process of claim 1, wherein the organic semiconductor film is formed from the organic semiconductor solution, and wherein the solution comprises a solvent that comprises at least one non-aqueous solvent.

15. The process of claim 14, wherein the solvent consists of one or more non-aqueous solvents.

16. The process of claim 15, wherein the non-aqueous solvents are not miscible with water at room temperature.

* * * * *